(12) United States Patent
Candy

(10) Patent No.: US 9,547,065 B2
(45) Date of Patent: Jan. 17, 2017

(54) METHOD FOR DETECTING FAST TIME CONSTANT TARGETS USING A METAL DETECTOR

(71) Applicant: Minelab Electronics Pty Limited, Torrensville (AU)

(72) Inventor: Bruce Halcro Candy, Torrensville (AU)

(73) Assignee: Minelab Electronics Pty Limited, Torrensville, South Australia (AU)

( * ) Notice: Subject to any disclaimer, the term of this patent is extended or adjusted under 35 U.S.C. 154(b) by 0 days.

(21) Appl. No.: 14/382,797

(22) PCT Filed: Mar. 6, 2013

(86) PCT No.: PCT/AU2013/000210
§ 371 (c)(1),
(2) Date: Sep. 4, 2014

(87) PCT Pub. No.: WO2013/131133
PCT Pub. Date: Sep. 12, 2013

(65) Prior Publication Data
US 2015/0035543 A1 Feb. 5, 2015

(30) Foreign Application Priority Data

Mar. 6, 2012 (AU) .................................. 2012900870

(51) Int. Cl.
*G01R 35/00* (2006.01)
*G01R 27/26* (2006.01)
*G01V 3/10* (2006.01)

(52) U.S. Cl.
CPC ........... *G01R 35/00* (2013.01); *G01R 27/2611* (2013.01); *G01V 3/10* (2013.01)

(58) Field of Classification Search
CPC ......... G01R 33/12; G01R 35/00; G01R 27/26; G01R 27/2611; G01V 3/10
USPC .......................................................... 324/602
See application file for complete search history.

(56) References Cited

U.S. PATENT DOCUMENTS

| | | | | |
|---|---|---|---|---|
| 3,747,011 A * | 7/1973 | Buck | ...................... | G01V 3/102 307/652 |
| 4,443,882 A * | 4/1984 | Rolfe | ...................... | H03H 11/48 333/214 |
| 4,507,612 A * | 3/1985 | Payne | ...................... | G01V 3/105 324/233 |
| 4,563,645 A * | 1/1986 | Kerr | ...................... | G01V 3/107 324/233 |
| 4,837,511 A * | 6/1989 | Whittington | ........... | G01V 3/102 324/204 |
| 2010/0141247 A1 * | 6/2010 | Candy | .................... | G01V 3/104 324/239 |

OTHER PUBLICATIONS

Gasser, Technology for Humanitarian Landmine Clearance, Thesis submitted to the University of Warwick, Sep. 2000, 86 pages.

* cited by examiner

*Primary Examiner* — Jermele M Hollington
*Assistant Examiner* — Zannatul Ferdous
(74) *Attorney, Agent, or Firm* — The Webb Law Firm

(57) ABSTRACT

A method for reducing a delay, between a transition of a transmission of a metal detector and a process of a receive signal received by a receive coil of the metal detector, due to a critically damped time constant of the receive coil, including: introducing a negative capacitance into the receive coil to reduce the critically damped time constant.

11 Claims, 2 Drawing Sheets

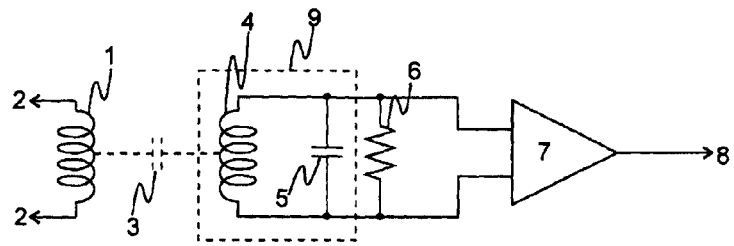
*Figure 1*
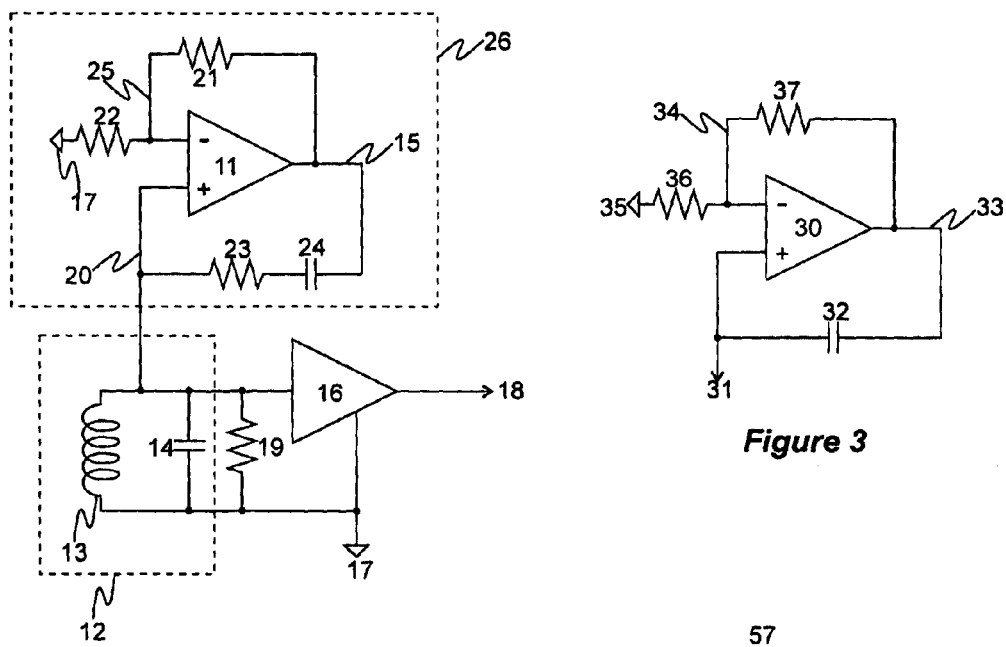
*Figure 2*
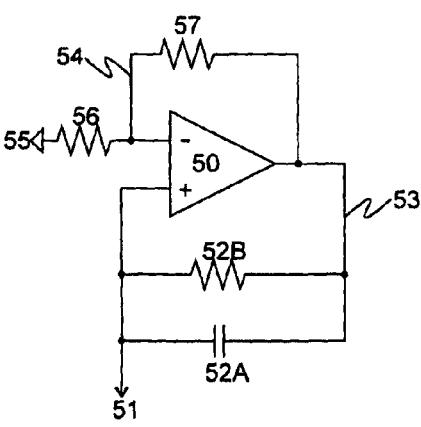
*Figure 3*
*Figure 4*
*Figure 5*

METHOD FOR DETECTING FAST TIME CONSTANT TARGETS USING A METAL DETECTOR

TECHNICAL FIELD

This invention relates to a method for detecting fast time constant targets using a metal detector.

INCORPORATION BY REFERENCE

This patent application claims priority from:
Australian Provisional Patent Application No 2012900870 titled "A Circuit of a Metal Detector" filed 6 Mar. 2012.

The entire content of this application is hereby incorporated by reference.

BACKGROUND ART

Time domain metal detectors usually synchronously demodulate (or sample) a receive signal from a receive coil commencing after a short delay following a voltage transition of a transmit signal, for example, after the back emf of a pulse induction (PI) transmit pulse, or after a switch from a high voltage (e.g. 200V) to a low-voltage (e.g. 5V) or to zero voltage. The short delay is to avoid the processing electronics from demodulating potential spurious interfering signals (unwanted signals) from mildly conductive soils. Typically, these signals from mildly conductive soil have signal components of particularly short duration; they will decay very rapidly. Detection of these signals is undesirable in a metal detector. Given that they were the only difficulty to be overcome, a short delay of the onset of demodulation after the transition of transmit signal would be sufficient to reduce their effect upon detection. In most detectors, however, the demodulation must be delayed by more than is required to remove the effect of the signals from mildly conductive ground. In most detectors, the minimum of the practical delay is usually limited by the time constant of the critically damped receive coil, either because the decaying transient signal components in the receive coil, due to a voltage transition of the transmit signal, contain signals related to the commonly major soil component known in the field of metal detection, namely the signal components due to soil reactive magnetic permeability, which is normally required to be nulled out, or to prevent said transients from causing receive signal electronic to overload, or both.

The required delay before demodulation, (or sampling), is undesirable for the detection of fast constant metal targets, because much of the decaying signal from the fast time constant targets following a transition of the transmit signal occurs during the delay, and thus most of this target signal is not added into the receive demodulation. Many sought buried metal targets have short time constants: for example; some minimum metal land mines, small gold nuggets, and fine jewellery. Improving the sensitivity to very short time constant targets requires reduction of the delay before demodulation, in turn requiring reduction of the time constant of the critically damped receive coil. Hitherto, this was usually achieved by choosing a low inductance for the receive coil, or eliminating the capacitive loading of the receive coils by the capacitance of the connecting cable, through installation of the receive preamplifier within the coil housing.

BRIEF SUMMARY OF THE INVENTION

According to a first aspect of the present invention, there is provided a method for reducing a delay, between a transition of a transmission of a metal detector and a process of a receive signal received by a receive coil of the metal detector, due to a critically damped time constant of the receive coil, including: introducing a negative capacitance into the receive coil to reduce the critically damped time constant.

In one form, the step of introducing the negative capacitance includes: connecting a negative capacitance generator to the receive coil.

In one form, the negative capacitance generator and the receive coil are connected to receive electronics for further processing.

In one form, the negative capacitance generator includes an amplifier with its non-inverting input connected to the receive coil.

In one form, the negative capacitance generator reduces an effective parallel capacitance of the receive coil.

In one form, the negative capacitance generator further amplifies the receive signal.

In one form, a feedback loop of the amplifier includes a small capacitance for improving the stability of the negative capacitance generator.

In one form, the negative capacitance generator includes at least a circuit element that compensates for distributed inductances and capacitances of the receive coil.

According to a second aspect of the present invention, there is provided a metal detector including a circuit to perform the method of the first aspect.

To assist with the understanding of this invention, reference will now be made to the drawings:

BRIEF DESCRIPTION OF THE DRAWINGS

FIG. 1 depicts a simple circuit of a metal detector to describe the problem addressed by the present invention; and FIGS. 2 to 9 depict various embodiments of the present invention.

DETAILED DESCRIPTION OF THE INVENTION

Figure 6:
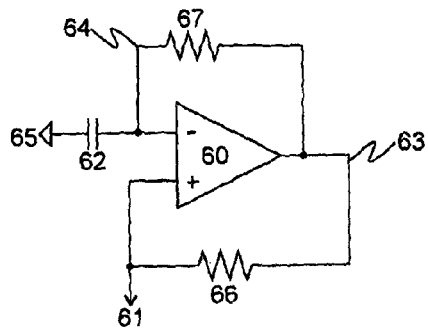

The present invention offers an alternative method over the prior art for detecting fast time constant targets using a metal detector. The method is to cancel part of the capacitance associated with the receive coil, both from its self-capacitance and the capacitance of the connecting cable, using a negative capacitance impedance generator. In practice, the critically damped time constant can be improved by a factor of about 0.5 to 0.7, e.g. a time constant of say 0.3 μs reduced to one of say 0.2 or 0.15 μs, with no signs of instability or any sort of undesirable artefacts at the time of writing.

FIG. 1 depicts a simple circuit of a metal detector, including a transmit winding 1 and a receive winding 4, to describe the problem addressed by the present invention.

The transmit winding 1 is connected 2 to transmit electronics (not shown) for receiving a transmit signal. A sudden transition in the transmit winding 1 can be capacitively coupled to the receive winding 4 through the virtual capacitance 3. If the magnetic null between the windings is imperfect, there can be magnetic coupling (not shown) of the sudden transitions as well. The receive winding 4, in parallel with its self-capacitance 5, forms a self-resonant element 9. The sudden transitions coupled to the receive winding 4 cause this self-resonant element 9 to oscillate at its natural frequency.

In a receive circuit of a metal detector, a resistor 6 is included to damp the oscillation of the self-resonant element. In order to quench the oscillations in minimum time, the value of the resistor 6 is selected that the resulting damping is at, or close to, critical damping. The damped signal is fed to the Rx pre-amplifier 7, and the output signal 8 is further processed.

Signals from some targets have very short time constants. Thus, their eddy currents decay to very low levels very quickly. In order for the detector to be sensitive to such targets, demodulation of the receive signal must commence very soon after sudden transitions of the transmission that excites the eddy currents.

In prior art, the commencement of demodulation must be designed to not incorporate significant contribution to its input from the self-oscillation of the self-resonant element 9, incorporating the receive winding 4. Thus, signals from targets with short time constants are almost completely decayed before demodulation begins. Such signals are lost to the detector after demodulation. There will be no indication, by the detector, of the presence of such targets.

The present invention is to introduce a circuit that presents an apparently negative capacitance to the receive winding 4, making it possible to adjust the value of the damping resistor 6 such that the decay of the oscillation of the self-resonant element 9 occurs more quickly than it would otherwise. This allows the earlier commencement of demodulation after sudden transition of transmission, facilitating the detection of targets with eddy currents of shorter time constants.

FIG. 2 shows a general form of a circuit in accordance with an aspect of the present invention designed to reduce the time taken for critical damping of oscillations in the receiver 12, which can be a receive coil; this figure includes amplification of the signals induced in the receive winding 13. The receiver 12 is modelled as a receive inductor 13 in parallel with a capacitor 14; resistance of the receive inductor 13 is not shown in this model. The capacitor 14 is a combination of the self-capacitance of the receive inductor 13, input capacitance of the amplifier 16, capacitance of any cables connected to the receive inductor 13 and the capacitance associated with associated connecting tracks and other physical features of the electronics.

The circuit 26 presents what appears to be a negative capacitance at the non-inverting input 20 of the amplifier 11. The amplifiers 11 and 16 can be operational amplifiers. The value of that negative capacitance is negative the value of the capacitor 24 multiplied by the value of resistance 21 and divided by the value of resistance 22. Resistance 22 is connected between the system reference ground 17 and the inverting input 25 of the amplifier 11. The amplifier 11 has a very high gain and very high input impedances at its inverting input 25 and its non-inverting input 20. The feedback resistor 21 is connected between the output 15 and the inverting input 25 of the amplifier 11. Capacitor 24 and resistor 23 are connected together in series; collectively they are connected between the output 15 and the non-inverting input 20 of the amplifier 11, providing a positive feedback path. The resistor 23 reduces the amount of positive feedback at high frequencies, but has a small value compared to the value of the reactance of the capacitor 24 near the resonant frequency of the receive inductor 13 in parallel with the capacitor 14.

The damping resistor 19 is connected across the receive inductor 13 and is also connected between the non-inverting input 20 of the amplifier 16 and the system reference ground 17. The value of the resistor 19 is selected so as to produce critical, or near-critical, damping of the circuit consisting of the receiver 12 connected to the circuit 26 via the connection to the non-inverting input 20. The output 18 of the amplifier 16 provides an amplified signal for further amplification and demodulation.

FIG. 3 shows an example of a basic negative capacitance generator. The output 31 of the generator is the non-inverting input of op-amp 30, and is connected to capacitance 32, which is connected between the op-amp output 33 and non-inverting input (which also acts as output 31) as a positive feedback path. Resistor 37 is connected between the op-amp output 33 and inverting input 34, to which resistor 36 is also connected. The other end of resistor 36 is connected to the system reference ground 35. If the value of resistor 37 is x times that of resistor 36, and the capacitance of capacitor 32 is c, then the impedance Z generated at 31 relative to ground 35 is $$Z = -\frac{1}{j\omega xc}$$

when ω is the frequency in rad/s.

Similarly, FIG. 4 shows a negative resistance generator where resistors 47 and 46 play the same role as resistors 37 and 36 in FIG. 3, and op-amp 40 with inverting input at 44, non-inverting at 41, output at 43, corresponds to op-amp 30. However, in place of a capacitor being connected between the op-amp output 43 and non-inverting input 41, is resistor 42 of resistance R. The impedance Z presented at 41 equals $$-\frac{R}{x}$$

Similarly, FIG. 5 shows a negative resistance and negative capacitance generator where resistors 57 and 56 play the same role as resistors 37 and 36 in FIG. 3, and op-amp 50 with inverting input at 54, non-inverting at 51, output at 53, corresponds to op-amp 30. However, in place of only a capacitor being connected between the op-amp output 53 and non-inverting input 51, is a resistor 52B of resistance R in parallel with capacitor 52A of capacitance c. The impedance Z presented at 51 is −R/x in parallel with −1/(jωxc).

An alternative negative capacitance generator is shown in FIG. 6. The output of the generator 61 is the non-inverting input of op-amp 60, and is connected to resistor 66, which is connected between the op-amp output 63 and non-inverting input as a positive feedback path. Resistor 67 is connected between the op-amp output 63 and inverting input 64, to which capacitor 62 is also connected. The other end of capacitor 62 is connected to the system reference ground 65. If the value of resistor 66 is x times that of resistor 67, and the capacitance of capacitor 62 is c, then the impedance Z generated at 51 relative to ground 65 is $$Z = -\frac{1}{j\omega xc}$$

Figure 7:
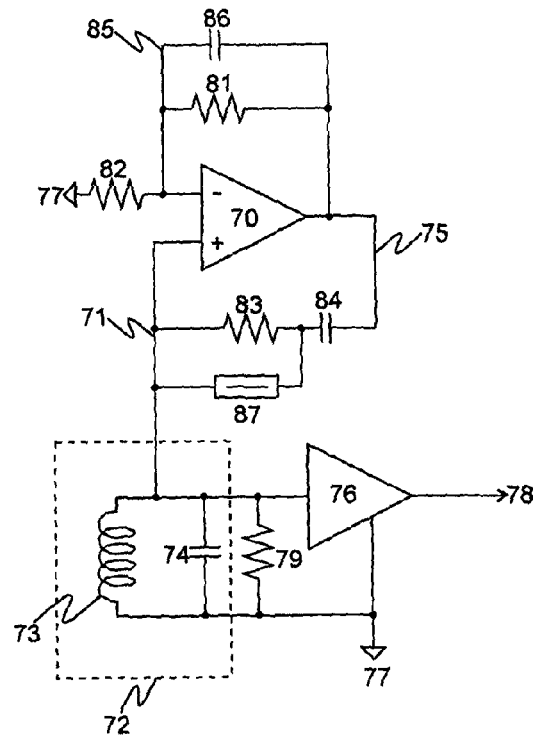

FIG. 7 shows another circuit capable of improving the detection of targets having short time constants. The output of the negative capacitance generator presented at 71 is the non-inverting input of op-amp 70, and is connected to series resistor 83 and capacitor 84, which is connected between the op-amp output 75 and non-inverting input 71 as a positive feedback path. Resistor 81 is connected between the op-amp output 75 and inverting input 85, to which resistor 82 is also connected. The other end of resistor 82 is connected to the system reference ground 77.

This generator is connected to the receive coil 72, effectively consisting of inductance 73 and effective receive coil capacitance 74, comprising a combination of the self-capacitance of the receive coil, the capacitance of any connecting cable, the input capacitance of the pre-amplifier 76, and any other stray capacitance associated with the receive coil. The series resistance of the receive coil is not shown.

A small-valued capacitor 86 (e.g. ~10 pF etc.) is connected in parallel with resistor 81. Both capacitor 86 and resistor 83 are included for stability. The small-valued capacitor 86 adds more negative feedback at higher frequencies than the resonant frequency of the receive inductor 73 in parallel with capacitor 74.

For simplicity, assume that resistor 82 and resistor 81 have equal value, capacitor 84 has capacitance c, resistor 83 has resistance r, and that capacitance of capacitor 86 is negligibly small. The impedance presented to the receive coil at 71 equals $$-\frac{1}{x}\left(r + \frac{1}{j\omega c}\right)$$

Suppose at a frequency $\omega=1/$(critically damped time constant), $1/(\omega c) \gg r$. For example, suppose c=150 pF, r=150Ω, then at say $\omega=1/0.25\mu$ rads, $1/(\omega c)=1.71$ kΩ$\gg$150Ω.

Thus the impedance presented at 71 of the negative impedance generator approximately equals a negative capacitance of 150 pF (with a relatively small effect of the 150Ω series resistance).

Further, supposing that the value of inductance 73 is 400 μH and the value of the capacitance 74 is 220 pF, the net effective capacitance in parallel with the inductor 73 is 70 pF owing to the negative capacitance, producing a critically damped time constant of approximately sqrt(70/220)=0.56 of that of just the critically damped coil without the active negative impedance generator. If the effect of resistor 83 is taken into account, the time constant is, now, effectively slightly more than 0.53 of the original time constant.

Resistor 79 is selected for critical damping with the active negative impedance generator connected, and the output 78 of preamplifier 76 is fed to the synchronous demodulators, or samplers or an Analogue-to-Digital Convertor.

It is also possible to include a ferrite bead 87 in parallel with resistor 83. Such an arrangement (indicated by dotted lines) may bring extra benefits in reducing the amount of positive feedback at high frequencies, but resistor 83 has a small impedance value compared with that of the capacitor 84 near the resonant frequency of the inductor 73 in parallel with capacitor 74. The role of the, ferrite bead 87 in effect is as a damped inductor to compensate to some extent a more realistic model of a real physical receive coil with its distributed inductances and capacitances at frequencies higher than the said resonant frequency of the inductor 73 in parallel with capacitor 74.

Figure 8:
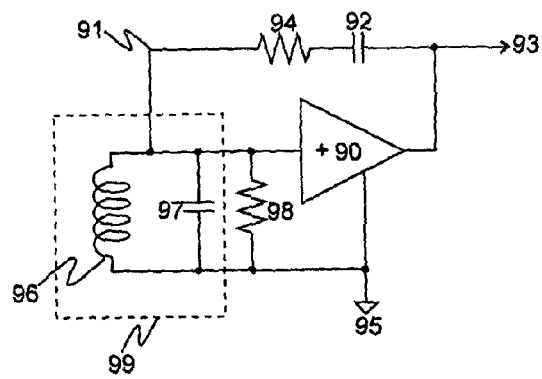

In FIG. 8, the receive coil 96 and its effective parallel capacitance 97 combine to produce a self-resonant element 99. A wideband preamplifier 90 is employed as both the receive preamplifier and for actively reducing the receive coil 96 effective parallel capacitance 97. This is achieved via a positive feedback path consisting of capacitor 92 in series with resistance 94 connected from the output 93 of preamplifier 90, to its non-inverting input 91 to which the receive coil 96 is also connected. Resistor 98 is connected across the receive coil 96 and selected for critical damping.

If the gain of the wideband preamplifier 90 is g, capacitor 92 of capacitance c, and resistor 94 of resistance r, then the impedance presented at node 91 by the positive feedback path is $$Z = -\frac{\left(r + \frac{1}{j\omega c}\right)}{g - 1}$$

Again, as long as $1/(\omega c) \gg r$, then this positive feedback path approximately acts to lower the effective input capacitance 97 and thus allows for a shorter receive coil critically damped time constant, thus allowing for demodulation to commence earlier compared to having no active feedback, and thus allowing for better detection of very short time constant metal targets.

Figure 9:
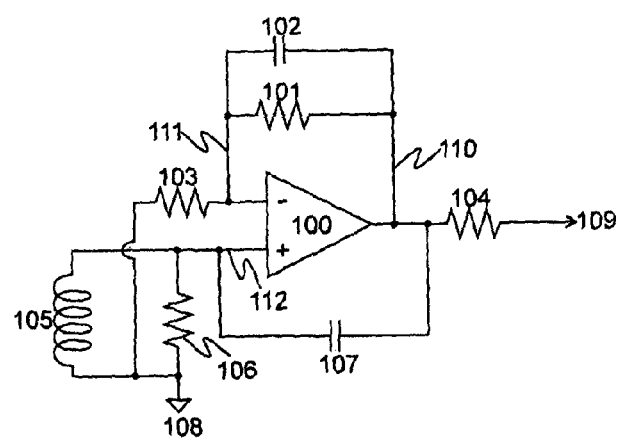

FIG. 9 shows another example of the one op-amp 100 being employed as the active element in a circuit to both reduce the effective parallel capacitance of the receive coil 105 and to amplify the receive signal from the receive coil 105. The effective parallel capacitance of the receive coil 105 is not shown in this figure.

Feedback resistor 101 and feedback capacitor 102, connected in parallel with each other, are connected between the output 110 and the inverting input 111 of op-amp 100. A resistor 103 is connected between the inverting input 111 of op-amp 100 and the system reference ground. Together, resistors 101 and 103 largely determine the low-frequency gain of the pre-amplifier. The resistor 104 is connected between the output 110 of op-amp 100 and the system for further processing the receive signal, and can shield the output 110 from any effects of the input 109 to the processing system.

The receive coil 105 and the damping resistor 106 are connected, in parallel, between the non-inverting input 112 and the system reference ground 108. The positive feedback capacitor 107 is connected between the non-inverting input 112 and the output 110 of the op-amp 100. The apparent impedance presented by the output at the non-inverting input 112 is $-1/j(g-1)\omega C$, where C is the value of the positive feedback capacitor 107 and g is the gain of the preamplifier at low frequencies ~1+R101/R103. The value of the damping resistor 106 is selected so as to produce critical, or near-critical, damping at the frequency of the receive coil 105 with its associated virtual capacitances (not shown) in combination with the negative capacitance presented at the non-inverting input 112.

In all the above examples, the receive coil may also act as a transmit coil, and by altering the forward phase of the op-amp/preamp slightly, the effects of the resistors 83 (of FIG. 7) or 94 in the active feedback paths may be reduced.

A detailed description of one or more preferred embodiments of the invention is provided above along with accompanying Figures that illustrate, by way of example, the principles of the invention. While the invention is described in connection with such embodiments, it should be understood that the invention is not limited to any embodiment. On the contrary, the scope of the invention is limited only by the appended claims and the invention encompasses numerous alternatives, modifications, and equivalents. For the purpose of example, numerous specific details are set forth in the description above in order to provide a thorough understanding of the present invention. The present invention may be practised according to the claims without some or all of these specific details. For the purpose of clarity, technical material that is known in the technical fields related to the invention has not been described in detail so that the present invention is not unnecessarily obscured.

Throughout this specification and the claims that follow, unless the context requires otherwise, the words 'comprise' and 'include' and variations such as 'comprising' and 'including' will be understood to imply the inclusion of a stated integer or group of integers, but not the exclusion of any other integer or group of integers.

The reference to any prior art in this specification is not, and should not be taken as, an acknowledgment or any form of suggestion that such prior art forms part of the common general knowledge of the technical field.

The invention claimed is:

1. A method for reducing a minimum delay, between (a) an end of a transition from a high voltage to a low voltage of a transmit signal of a metal detector and (b) a beginning of a demodulation, following the end of the transition, of a receive signal received by a receive coil of the metal detector, the minimum delay limited by a time constant of the receive coil when the receive coil is critically damped, the method including:
   connecting a negative capacitance generator to the receive coil to introduce a negative capacitance to the receive coil to reduce the time constant of the receive coil when the receive coil is critically damped; and
   reducing an amount of a positive feedback of the negative capacitance generator at frequencies higher than the resonant frequency of the receive coil to compensate for distributed inductances and capacitances of the receive coil.

2. The method of claim 1, wherein the step of reducing an amount of the positive feedback includes adding an inductive element to a positive feedback path of the negative capacitance generator.

3. The method of claim 1, wherein the negative capacitance generator includes a positive feedback path, and wherein the positive feedback path includes a first capacitor in series with a first resistor.

4. The method of claim 3, wherein the positive feedback path further includes an inductive element in parallel with the first resistor.

5. The method of claim 1, wherein the negative capacitance generator includes a negative feedback path, and wherein the negative feedback path includes a second capacitor in parallel with a second resistor.

6. The method of claim 1, wherein the negative capacitance generator includes an amplifier, a positive feedback path for the amplifier, and a negative feedback path for the amplifier; and wherein the positive feedback path includes a first capacitor in series with a first resistor, and an inductive element in parallel with the first resistor;
   and the negative feedback path includes a second capacitor in parallel with a second resistor.

7. A metal detector including a circuit to perform the method of claim 1.

8. A metal detector including a circuit capable of reducing a minimum delay, between (a) an end of a transition from a high voltage to a low voltage of a transmit signal of the metal detector and (b) a beginning of a demodulation, following the end of the transition, of a receive signal received by a receive coil of the metal detector, the minimum delay limited by a time constant of the receive coil when the receive coil is critically damped, the metal detector including:
   a negative capacitance generator connected to the receive coil to introduce a negative capacitance to the receive coil to reduce the time constant of the receive coil when the receive coil is critically damped; and
   a circuit for reducing an amount of a positive feedback of the negative capacitance generator at frequencies higher than the resonant frequency of the receive coil to compensate for distributed inductances and capacitances of the receive coil.

9. The method of claim 2, wherein the negative capacitance generator includes a negative feedback path, and wherein the negative feedback path includes a second capacitor in parallel with a second resistor.

10. The method of claim 3, wherein the negative capacitance generator includes a negative feedback path, and wherein the negative feedback path includes a second capacitor in parallel with a second resistor.

11. The method of claim 4, wherein the negative capacitance generator includes a negative feedback path, and wherein the negative feedback path includes a second capacitor in parallel with a second resistor.

* * * * *